(12) United States Patent
Okamoto

(10) Patent No.: US 7,282,993 B2
(45) Date of Patent: Oct. 16, 2007

(54) FREQUENCY CHARACTERISTICS-VARIABLE AMPLIFYING CIRCUIT AND SEMICONDUCTOR INTEGRATED CIRCUIT DEVICE

(75) Inventor: Fuyuki Okamoto, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 66 days.

(21) Appl. No.: 10/808,619

(22) Filed: Mar. 25, 2004

(65) Prior Publication Data
US 2004/0189387 A1    Sep. 30, 2004

(30) Foreign Application Priority Data
Mar. 28, 2003    (JP)    ............... 2003-092486

(51) Int. Cl.
*H03F 3/45* (2006.01)
*H03F 3/04* (2006.01)

(52) U.S. Cl. .................. 330/253; 330/302; 330/252

(58) Field of Classification Search ............... 330/253, 330/302
See application file for complete search history.

(56) References Cited

U.S. PATENT DOCUMENTS

| | | | |
|---|---|---|---|
| 6,060,956 A * | 5/2000 | Mole et al. ............ | 331/117 R |
| 6,340,899 B1 | 1/2002 | Green ..................... | 326/115 |
| 6,600,363 B2 * | 7/2003 | Minch .................... | 327/563 |
| 6,784,735 B2 * | 8/2004 | Lin ......................... | 330/253 |
| 2003/0184378 A1 * | 10/2003 | Segawa .................. | 330/254 |

FOREIGN PATENT DOCUMENTS

| | | | |
|---|---|---|---|
| GB | 2288502 A | * | 10/1995 |
| JP | 11-88087/1999 | | 3/1999 |

OTHER PUBLICATIONS http://www.electronics-tutorials.com/oscillators/voltage-controlled-oscillators.htm, Voltage Controlled Oscillators, May 8, 2005, p. 2.*

* cited by examiner

*Primary Examiner*—Robert Pascal
*Assistant Examiner*—Krista M. Flanagan
(74) *Attorney, Agent, or Firm*—Scully, Scott, Murphy & Presser, P.C.

(57) ABSTRACT

From power supply potential wiring to ground potential wiring, a first inductor, a first resistance, a first output terminal, and a first transistor are series-connected in this order, and in parallel with these, a second inductor, a second resistor, a second output terminal, and a second transistor are series-connected in this order. And, one electrode of a first variable capacitor is connected between the first inductor and first resistor, and one electrode of a second variable capacitor is connected between the second inductor and second resistor. The other electrodes of the first variable capacitor and second variable capacitor are connected to a first frequency characteristics control terminal and a second frequency characteristics control terminal, respectively. In addition, drains of the first transistor and second transistors are connected to the first output terminal and second output terminal, respectively, sources of the same are connected to a drain of a third transistor, and gates of the same are connected to a first input terminal and a second input terminal, respectively. Furthermore, a gate of the third transistor is connected to a bias terminal, and a source of the same is connected to the ground potential wiring.

16 Claims, 5 Drawing Sheets

FREQUENCY CHARACTERISTICS-VARIABLE AMPLIFYING CIRCUIT AND SEMICONDUCTOR INTEGRATED CIRCUIT DEVICE

BACKGROUND OF THE INVENTION

1. Field of the Invention

The present invention relates to a frequency characteristics-variable amplifying circuit for amplifying a high-frequency signal and a semiconductor integrated circuit device mounted with this frequency characteristics-variable amplifying circuit.

2. Description of the Related Art

An optical communications receiving module is mounted with a photo-detector to convert a light signal to an electric signal and a broadband amplifier into which an electric signal outputted from this photo-detector is inputted and which rectifies a signal waveform attenuated and distorted during a transmission through an optical fiber. This broadband amplifier is composed of an amplifier mainly for amplifying an attenuated signal and an amplifier for mainly rectifying a waveform disorder. Recently, with the realization of downsized and low-cost optical communications modules, broadband amplifiers wherein the respective amplifiers are formed as an integrated circuit on a single semiconductor substrate by use of a bipolar integrated circuit-manufacturing technique have been developed (see Japanese Patent Laid-Open Publication No. 88087/1999 and Specification of U.S. Pat. No. 6,340,899 B1).

As an example of an amplifying circuit provided in such a prior-art broadband amplifier, description will be given of an amplifying circuit as described in U.S. Pat. No. 6,340,899 B1. FIG. 1 is a circuit diagram showing a prior-art frequency characteristics-variable amplifying circuit as described in U.S. Pat. No. 6,340,899 B1. As shown in FIG. 1, this prior-art amplifying circuit 50 is connected to power supply potential wiring and ground potential wiring. And, in the amplifying circuit 50, from the power supply potential wiring to the ground potential wiring, an inductor 51, a resistor 53, an output terminal 55, and an NMOS transistor 59 are series-connected in this order, and in parallel with these, an inductor 52, a resistor 54, an output terminal 56, and an NMOS transistor 60 are series-connected in this order. In addition, to gates of the NMOS transistor 59 and the NMOS transistor 60, an input terminal 61 and an input terminal 62 are connected, respectively, and sources of the NMOS transistor 59 and the NMOS transistor 60 are connected to the ground potential wiring via a transistor 63. Furthermore, to a gate of this transistor 63, a bias terminal 64 to which a bias potential is applied is connected. Herein, a load capacitance 57 and a load capacitance 58 shown in FIG. 1 each show parasitic capacitance, which inevitably occurs between this amplifying circuit 50 and ground potential wiring.

Next, operations of this prior-art amplifying circuit 50 will be described. First, a power supply potential is applied to the power supply potential wiring, a ground potential is applied to the ground potential wiring, and a bias potential is applied to the transistor 63. In this condition, for example, when complementary signals are inputted so that the input terminal 61 becomes high and the input terminal 62 becomes low, the NMOS transistor 59 is turned on, and the NMOS transistor 60 is turned off. Thereby, a low signal is outputted from the output terminal 55, and a high signal is outputted from the output terminal 56.

In a case of this prior-art amplifying circuit 50, an output signal voltage is a potential difference between the output terminal 55 and the output terminal 56, and the greater this potential difference is, the greater the gain becomes. FIG. 2 is a graph showing frequency characteristics of a gain where the horizontal axis shows a frequency and the vertical axis shows a gain. As shown in FIG. 2, in general, when an amplifying circuit is used, peaking of its gain occurs in a high-frequency region. In terms of the amplifying circuit 50 shown in FIG. 1, since the inductor 51 and inductor 52 are provided within the circuit, the peaking value becomes great in the gain frequency characteristics as shown in FIG. 2, and an output signal waveform can be sharpened.

However, since the prior-art amplifying circuit 50 cannot vary frequency characteristics of inputted signals, the amplifying circuit cannot control the peaking position and cannot correspond to frequencies other than a frequency presumed in design, therein exists a problem.

SUMMARY OF THE INVENTION

It is an object of the present invention to provide a frequency characteristics-variable amplifying circuit and a semiconductor integrated circuit device, which can vary frequency characteristics of inputted signals.

A frequency characteristics-variable amplifying circuit according to the present invention is an amplifying circuit which comprises: a pair of resonant circuits, each of which is connected between a first potential and a second potential, and has an inductor and a variable capacitor which forms a resonant section with the inductor; a pair of output terminals, each of which outputs an output signal from corresponding resonant circuit; and a pair of switch sections, one of the switch sections switching on and off between one of the resonant circuit and the first potential or the second potential based on one of complementary signals inputted to the switch sections to make the one of resonant circuit to output a high or low signal determined by the first potential or the second potential to the corresponding output terminal, and the other of the switch sections switching on and off between the other of the resonant circuit and the first potential or the second potential based on the other of complementary signals inputted to the switch sections to make the other of resonant circuit to output a high or low signal determined by the first potential or the second potential to the corresponding output terminal, wherein amplified signals of the complementary signals are outputted to the pair of output terminals, and frequency characteristics at the time of amplification can be varied by adjusting the capacitance value of the variable capacitor.

A load impedance in the frequency characteristics-variable amplifying circuit of the present invention is a composite impedance of resonant circuits. The value of this composite impedance is changed by changing the capacitance value of a variable capacitor, which forms a resonant section with the inductor. Accordingly, in the present invention, when a voltage to be applied to the variable capacitor is changed to change the capacitance value of this capacitor, the load impedance is changed to change frequency characteristics of an output signal.

Another frequency characteristics-variable amplifying circuit according to the present invention comprises: a pair of resonant circuits, each of which has an inductor a first potential being applied to one end of the inductor, and a variable capacitor which forms a resonant section with the inductor; a pair of output terminals, each of which is connected to the other end of the inductor of corresponding resonant circuit; and a pair of switch sections, each of which is connected between corresponding output terminal and a second potential, and one of the switch sections switching on and off between one of the output terminals and the second potential based on one of complementary signals inputted to the switch sections, and the other of the switch sections switching on and off between the other of the output terminals and the second potential based on the other of complementary signals inputted to the switch sections, wherein amplified signals of the complementary signals are outputted to the pair of output terminals, and impedance frequency characteristics of the resonant circuit are adjusted by adjusting the capacitance value of the variable capacitor so as to rectify the waveform of the output signals.

A load impedance in the frequency characteristics-variable amplifying circuit of the present invention is a composite impedance of resonant circuits each provided with a variable capacitor and an inductor. The value of this composite impedance is changed by changing the capacitance of a variable capacitor. Accordingly, in the frequency characteristics-variable amplifying circuit of the present invention, when a voltage to be applied to the variable capacitor is changed to change the capacitance value of this capacitor, the load impedance is changed to change frequency characteristics of an output signal, whereby the waveform of the output signal is rectified.

The variable capacitor may be a variable capacitor to whose one end, the other end of the inductor is connected and to the other end, a control voltage to control the capacitance value of this variable capacitor is applied, and the resonant circuit further has a resistor connected between a connecting point between the inductor and the variable capacitor and the output terminal. When the resistor is provided in the resonant circuit, a potential difference between the pair of output terminals is secured in a low-frequency region, whereby a decline in the gain is prevented.

For example, the variable capacitor is a varactor element. Thereby, the variable capacitor can be formed by a process for forming a MOS transistor. Therefore, it is unnecessary to add a special process to form a variable capacitor.

Furthermore, it is satisfactory that each switch section is a transistor one of whose source and drain is connected to the output terminal, the second potential is applied to the other, and to whose gate, the input signal is inputted.

Still furthermore, in the frequency characteristics-variable amplifying circuit, for example, the other of the transistor's source and drain of each switch section is commonly connected, a bias transistor is connected between this common connecting point and the second potential, and a bias voltage is applied to a gate of this bias transistor, and the bias transistor controls the second potential according to the bias voltage. By changing this bias voltage applied to the bias transistor, the magnitude of current to flow over the entire frequency characteristics-variable amplifying circuit can be changed.

A semiconductor integrated circuit device according to the present invention has the above-described frequency characteristics-variable amplifying circuit. In the present invention, by mounting the above-described frequency characteristics-variable amplifying circuit on a semiconductor integrated circuit device together with a gain-variable amplifying circuit, etc., a broadband amplifier which can vary frequency characteristics of output signals can be manufactured.

According to the present invention, by providing a variable capacitor in a frequency characteristics-variable amplifying circuit and changing a control voltage to be applied to this variable capacitor, a load impedance inside the above-described frequency characteristics-variable amplifying circuit can be changed. Thereby, since frequency characteristics of inputted signals are changed, even when various signals are inputted, the waveform of output signals can be rectified.

DETAILED DESCRIPTION OF THE PREFERRED EMBODIMENT

Figure 1:
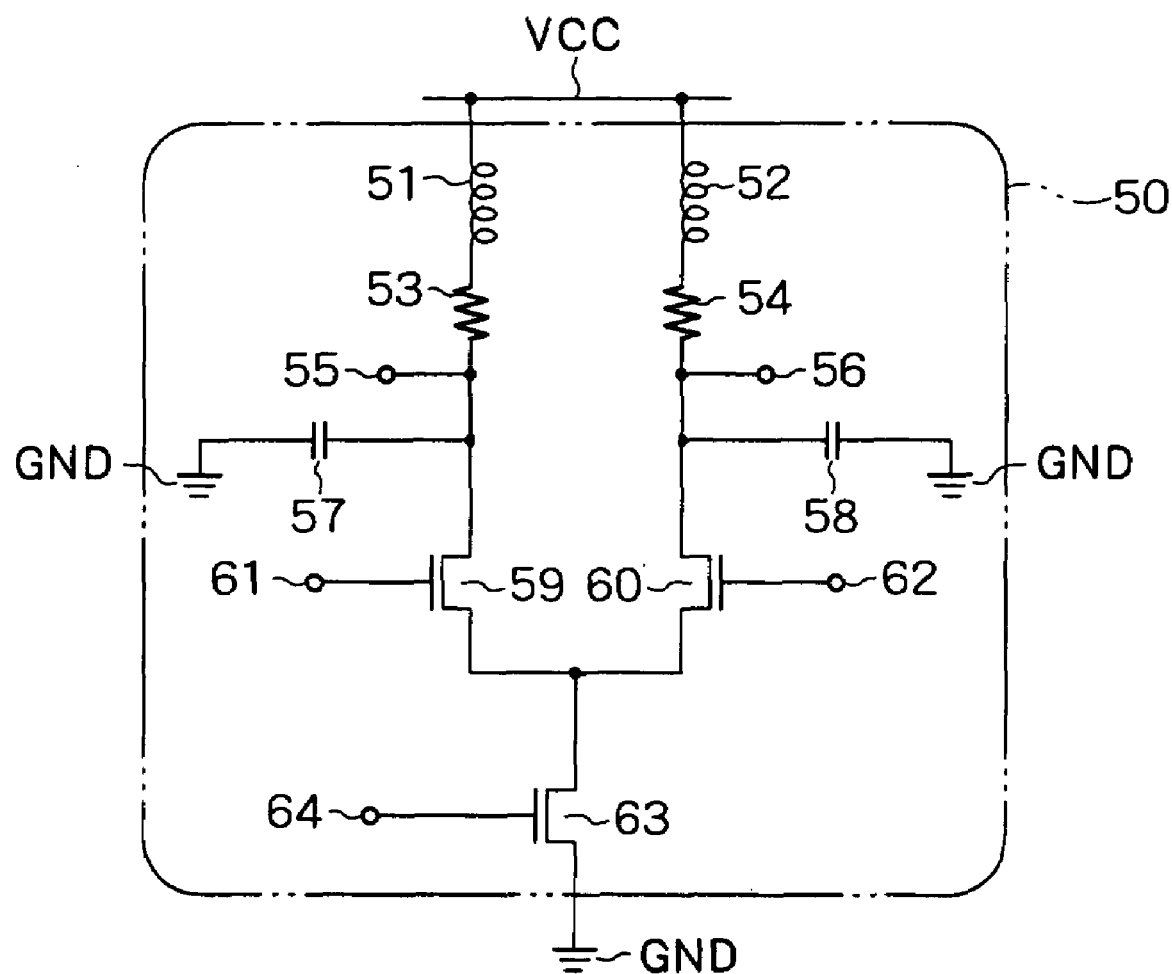
FIG. 1 is a circuit diagram showing a prior-art frequency characteristics-variable amplifying circuit as described in U.S. Pat. No. 6,340,899 B1.
Figure 2:
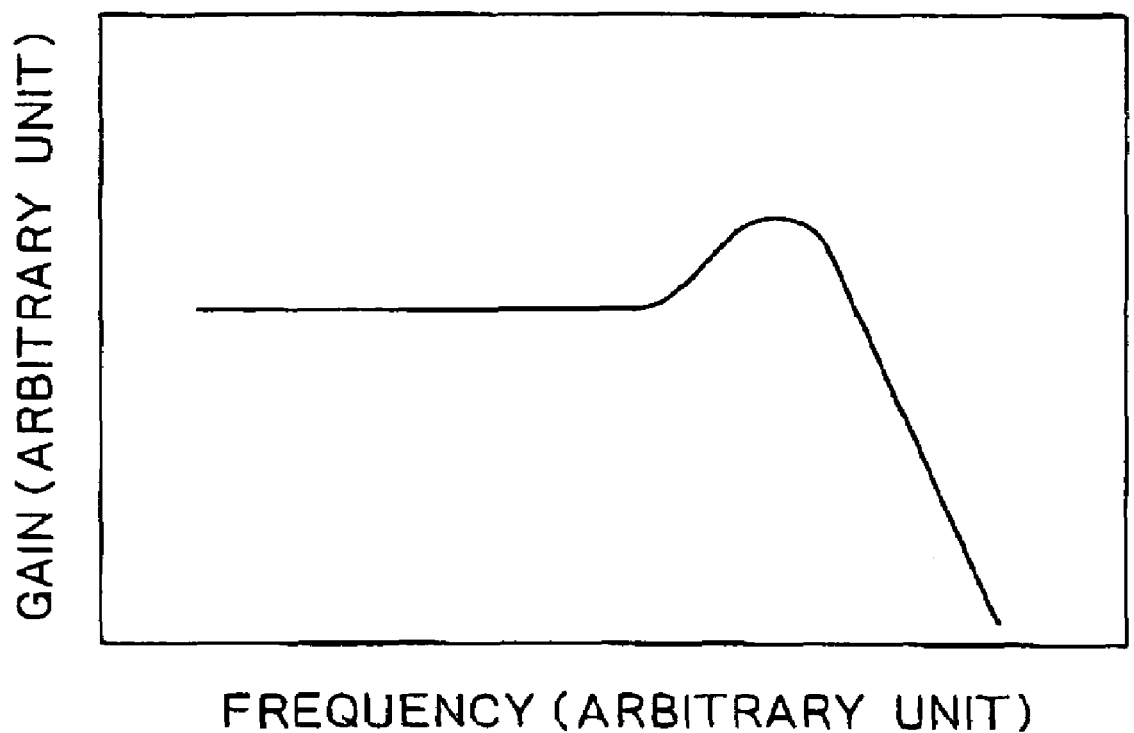
FIG. 2 is a graph showing frequency characteristics of a gain where the horizontal axis shows a frequency and the vertical axis shows a gain.
Figure 3:
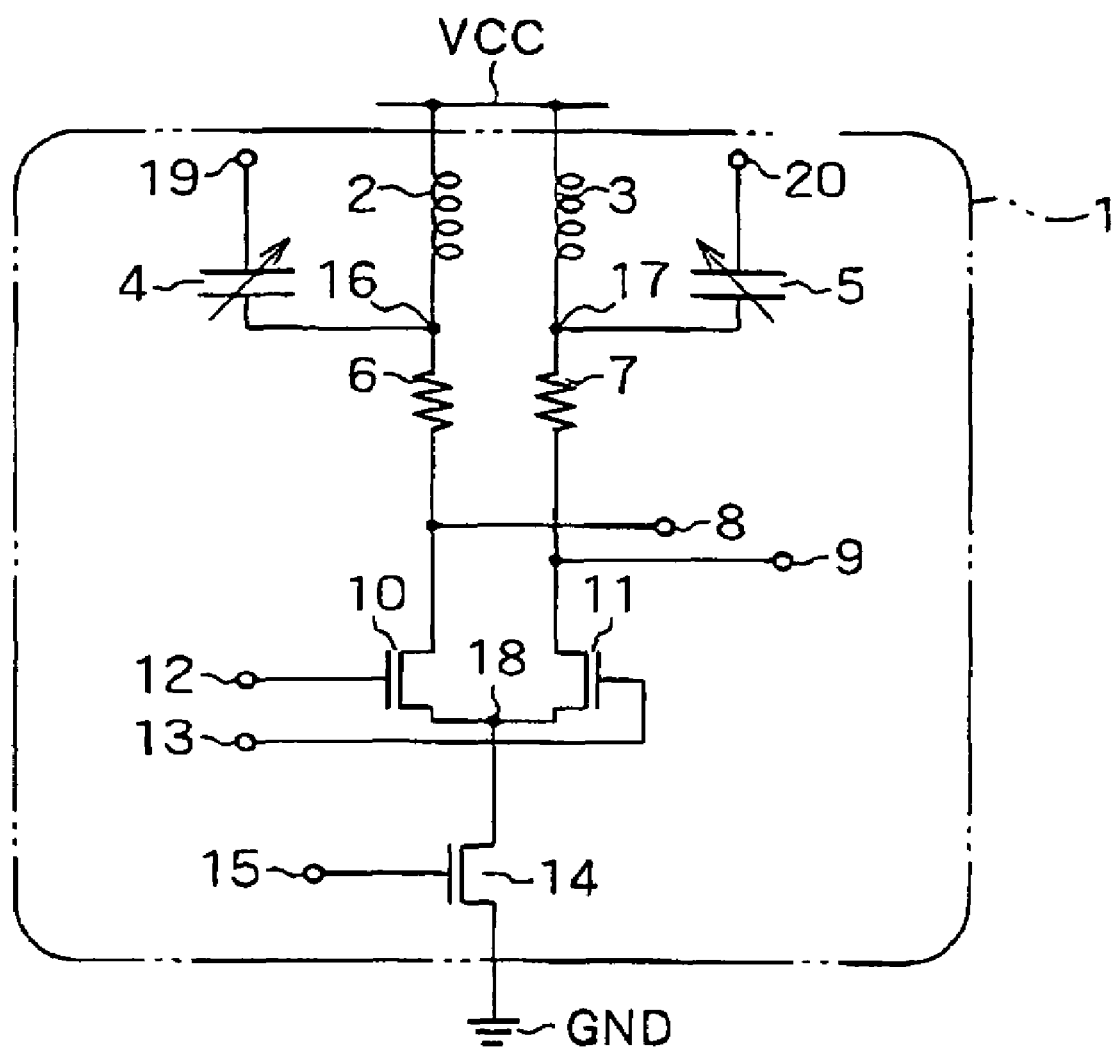
FIG. 3 is a circuit diagram showing a frequency characteristics-variable amplifying circuit according to an embodiment of the present invention.

Hereinafter, a frequency characteristics-variable amplifying circuit according to the embodiment of the present invention will be described in detail with reference to the attached drawings. FIG. 3 is a circuit diagram showing the frequency characteristics-variable amplifying circuit according to the embodiment of the present invention. As shown in FIG. 3, a frequency characteristics-variable amplifying circuit 1 of the present embodiment is connected between power supply potential wiring and ground potential wiring. This frequency characteristics-variable amplifying circuit 1 is, for example, a part of an integrated circuit formed on a silicon substrate. In the frequency characteristics-variable amplifying circuit 1, from the power supply potential wiring to the ground potential wiring, an inductor 2, a resistor 6, an output terminal 8, and an NMOS transistor 10 are series-connected in this order, and in parallel with these, an inductor 3, a resistor 7, an output terminal 9, and an NMOS transistor 11 are connected. To a connecting point 16 between the inductor 2 and the resistor 6, one terminal of a varactor element 4 as a variable capacitor is connected, and the other terminal of this varactor element 4 is connected to frequency characteristics control terminal 19. Similarly, to a connecting point 17 between the inductor 3 and the resistor 7, one electrode of a varactor element 5 is connected, and the other electrode of this varactor element 5 is connected to a frequency characteristics control terminal 20. Herein, one resonant circuit is formed by the inductor 2, the varactor element 4, and the resistor 6, and the other resonant circuit is formed by the inductor 3, the varactor element 5, and the resistor 7.

And, drains of the NMOS transistor 10 and the NMOS transistor 11 are connected to the output terminal 8 and the output terminal 9, respectively, and to gates thereof, an input terminal 12 and an input terminal 13 are connected, respectively. In addition, sources of the NMOS transistor 10 and the NMOS transistor 11 are connected to the ground potential wiring via a transistor 14. Namely, a drain of the transistor 14 is connected to the sources of the NMOS transistor 10 and the NMOS transistor 11, and a source thereof is connected to the ground potential wiring. Furthermore, to a gate of the transistor 14, a bias terminal 15 to which a bias potential is applied is connected.

The frequency characteristics-variable amplifying circuit 1 according to the present embodiment is formed on a semiconductor substrate together with a gain-variable amplifying circuit, etc., by use of manufacturing techniques for a bipolar-type integrated circuit and a MOS-type integrated circuit, and becomes a semiconductor integrated circuit device which operates as a broadband amplifier which can amplify high-frequency signals of a GHz band, etc. For example, this semiconductor integrated circuit device (broadband amplifier) may be mounted on a substrate together with other members including a light-receiving element and incorporated in a light-receiving module of an optical communications optical fiber. This light-receiving module is for converting a signal transmitted through an optical fiber to an electrical signal and amplifying the same.

Next, operations of the frequency characteristics-variable amplifying circuit 1 of the present embodiment will be described. As shown in FIG. 3, in the frequency characteristics-variable amplifying circuit 1 of the present embodiment, a power supply potential is applied to the power supply wiring, and a ground potential is applied to the ground potential wiring. And, a bias voltage is applied to the gate of the transistor 14 via the bias terminal 15. Thereby, voltage-current characteristics of the transistor 14 reach a saturation region, and a drain current, which is determined by a gate voltage and does not depend on a drain voltage, flows between the source and drain of the transistor 14. As a result, by making the bias voltage a fixed value, a fixed electric current can be flowed to the frequency characteristics-variable amplifying circuit 1 without depending on a potential difference between a connecting point 18 and the ground potential wiring. In this condition, for example, when complementary signals are inputted so that the input terminal 12 becomes high and the input terminal 13 becomes low, the transistor 10 is turned on, and the transistor 11 is turned off. Thereby, a low signal is outputted from the output terminal 8, and a high signal is outputted from the output terminal 9. In addition, when the input terminal 12 becomes low and the input terminal 13 becomes high, then the output terminal 8 becomes high, and the output terminal 9 becomes low. In such a manner, amplified complementary signals with a frequency the same as that of the signals inputted into the input terminal 12 and the input terminal 13 are outputted from the output terminal 9 and the output terminal 10.

Figure 4A:
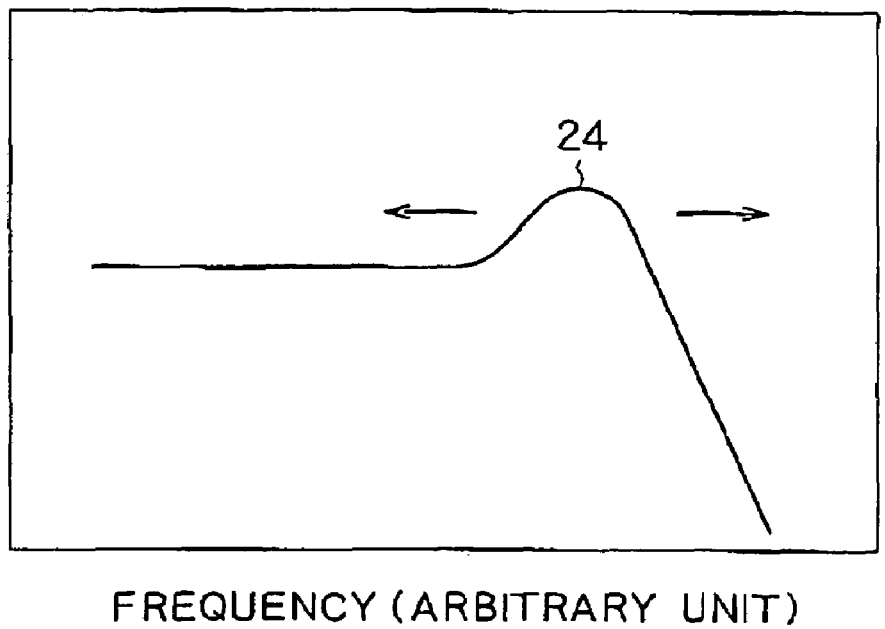
FIG. 4A is a graph showing frequency characteristics of a gain where the horizontal axis shows an output signal frequency and the vertical axis shows a gain.
Figure 4B:
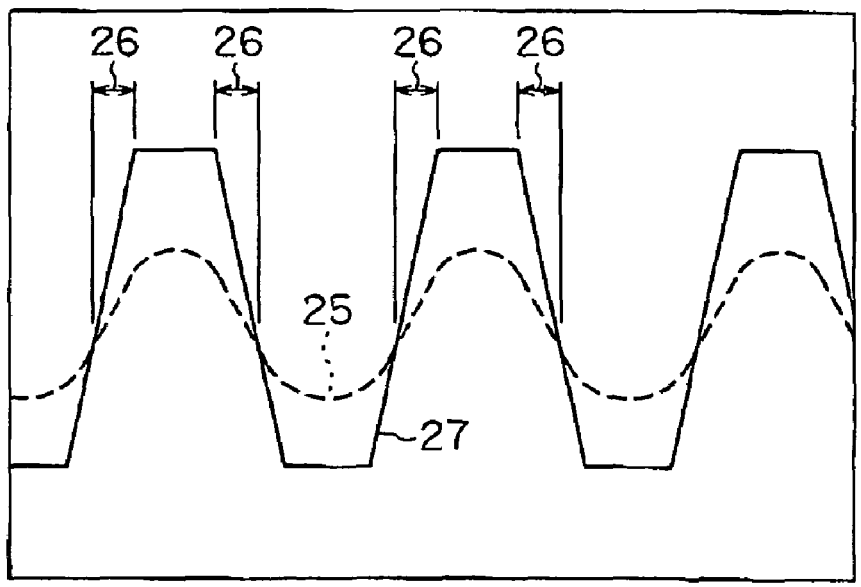
FIG. 4B is a graph showing waveforms of an input signal and an output signal where the horizontal axis shows time and the vertical axis shows potential.

FIG. 4A is a graph showing frequency characteristics of a gain where the horizontal axis shows an output signal frequency and the vertical axis shows a gain, and FIG. 4B is a graph showing waveforms of an input signal and an output signal where the horizontal axis shows time and the vertical axis shows potential. In the frequency characteristics-variable amplifying circuit 1 of the present embodiment, when potential to be applied to the frequency characteristics control terminal 19 and the frequency characteristics control terminal 20 is changed, capacitance of the varactor element 4 and the varactor element 5 is changed. Thereby, impedance frequency characteristics of the resonant circuit are changed, and as shown in FIG. 4A, the gain frequency characteristics of an output signal with respect to an input signal, namely, the peaking 24 position, etc., are changed. Therefore, by adjusting the potential to be applied into the frequency characteristics control terminal 19 and the frequency characteristics control terminal 20, the gain frequency characteristics are optimized, and as shown in FIG. 4B, for an input signal 25 which has been attenuated as a result of a transmission and whose waveform has been distorted, by selectively amplifying parts 26 of this input signal 25 with a great potential change and a plurality of high-frequency components, a rectified output signal 27 can be obtained. Herein, the resistor 6 and the resistor 7 are provided to secure impedance of the resonant sections when the input signals are low-frequency signals and to maintain a fixed gain.

The frequency characteristics-variable amplifying circuit 1 of the present embodiment can change, even when various signals are inputted, by changing the voltage to be applied to the frequency characteristics control terminal, the peaking position of the inputted signals so as to rectify the waveform of signals to be outputted.

Figure 5:
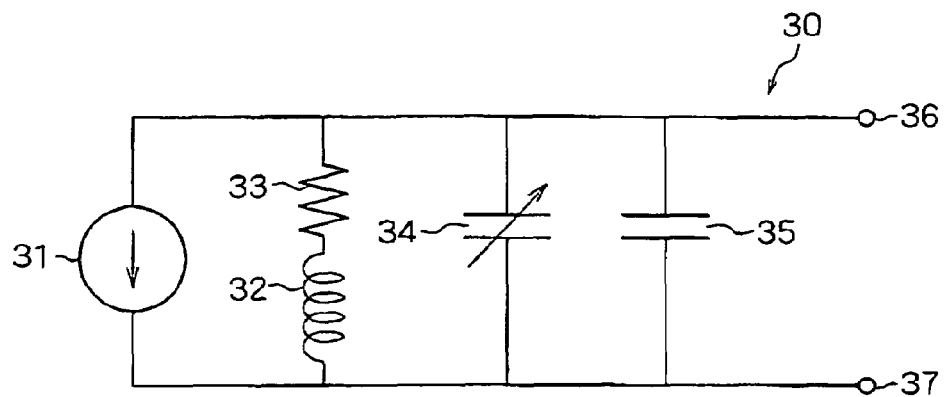
FIG. 5 is a circuit diagram showing a small signal circuit used for a calculation in an example of the present invention.

Hereinafter, as an example of the present invention, frequency characteristics of the frequency characteristics-variable amplifying circuit 1 as shown in FIG. 3 will be determined by a calculation, and effects thereof will be described in detail. In the present example, the frequency characteristics amplifying circuit 1 is modeled by equivalent circuits, and gain frequency characteristics of the output signals are determined by a calculation. FIG. 5 is a circuit diagram showing a small signal circuit as an equivalent circuit of the frequency characteristics amplifying circuit 1 used in the calculation of the present example. As shown in FIG. 5, in the small signal circuit 30 used in the present example, an inductor 32 and a resistor 33 are series-connected between a current source 31, an output terminal 36, and an output terminal 37, and a variable capacitor 34 is connected in parallel with a circuit composed of the inductor 32 and the resistor 33, and furthermore, a capacitor 35 is connected in parallel with the variable capacitor 34.

In the present example, the frequency variable amplifying circuit 1 is modeled wherein two small signal circuits 30 are arranged in right and left symmetry. Accordingly, the current source 31 of the small signal circuit 30 is equivalent to the NMOS transistor 10 and the NMOS transistor 11 of the frequency variable amplifying circuit 1. In addition, the inductor 32 is equivalent to the inductor 2 and the inductor 3, and the resistor 33 corresponds to the resistor 6 and the resistor 7. Furthermore, the variable capacitor 34 and the capacitor 35 correspond to the varactor element 4 and the varactor element 5.

In the present example, gains from 0.1 through 10 GHz are calculated where a resistance value R of the resistor 33 of the small signal circuit 30 is provided as 100Ω, an inductance L of the inductor 32 is provided as 10nH, a capacitance $C_L$ of the capacitor 35 is provided as 500fF, a case where a capacitance $C_v$ of the variable capacitor 34 is 100fF is provided as Example No. 1, a case where a capacitance $C_v$ of the variable capacitor 34 is 250fF is provided as Example No. 2, and a case where a capacitance $C_v$ of the variable capacitor 34 is 500fF is provided as Example No. 3. Then, gains determined by these calculations are standardized while a gain when a direct-current signal is inputted is provided as 1.

Figure 6:
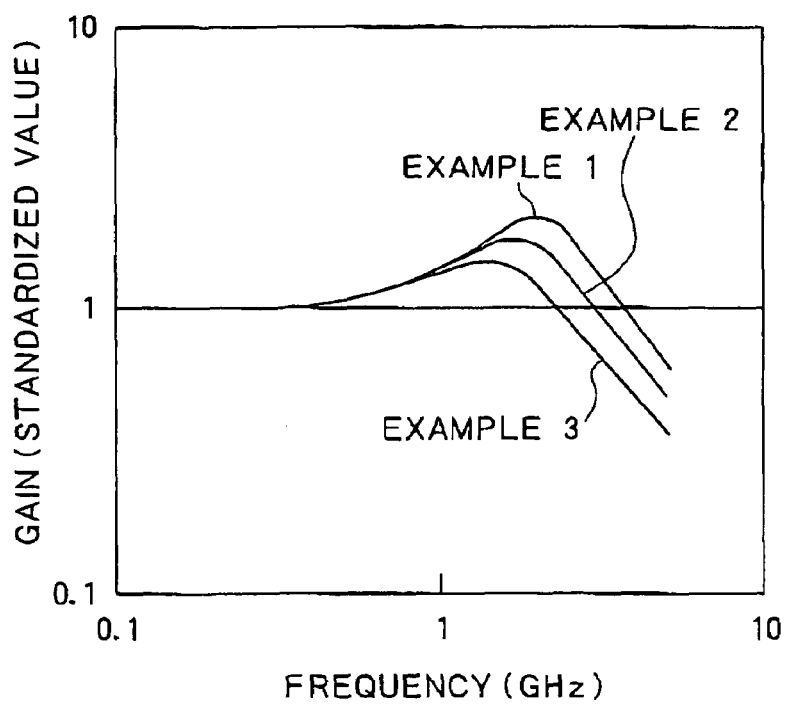
FIG. 6 is a graph showing frequency characteristics of gains in Examples No. 1, No. 2, and No. 3 where the horizontal axis shows a frequency and the vertical axis shows a standardized gain.

FIG. 6 is a graph showing frequency characteristics of gains in Examples No. 1, No. 2, and No. 3 where the horizontal axis shows a frequency and the vertical axis shows a standardized gain. As shown in FIG. 6, the frequency characteristics-variable amplifying circuit 1 as shown in FIG. 3 can change the peaking position (frequency) by changing the capacitance $C_v$ of the variable capacitor 34.

What is claimed is:

1. A frequency characteristics-variable amplifying circuit comprising:
a pair of resonant circuits, each of which is connected between a first potential and a second potential, and has an inductor and a variable capacitor which forms a resonant section with said inductor;
a pair of output terminals, each of which outputs an output signal from corresponding resonant circuit; and
a pair of switch sections, one of said switch sections switching on and off between one of said resonant circuit and said first potential or said second potential based on one of complementary signals inputted to said switch sections to make said one of said resonant circuit to output a high or low signal determined by said first potential or said second potential to said corresponding output terminal, and the other of said switch sections switching on and off between the other of said resonant circuit and said first potential or said second potential based on the other of complementary signals inputted to said switch sections to make said the other of resonant circuit to output a high or low signal determined by said first potential or said second potential to said corresponding output terminal,
wherein amplified signals of said complementary signals are outputted to said pair of output terminals, and frequency characteristics at the time of amplification can be varied by adjusting the capacitance value of said variable capacitor.

2. The frequency characteristics-variable amplifying circuit according to claim 1, wherein
said variable capacitor is a varactor element.

3. The frequency characteristics-variable amplifying circuit according to claim 1, wherein
said each switch section is a transistor one of whose source and drain is connected to said output terminal, said second potential is applied to the other, and to whose gate, said input signal is inputted.

4. The frequency characteristics-variable amplifying circuit according to claim 3, wherein
the other of the transistor's source and drain of said each switch section is commonly connected, a bias transistor is connected between this common connecting point and said second potential, and a bias voltage is applied to a gate of this bias transistor, and said bias transistor controls said second potential according to said bias voltage.

5. A frequency characteristics-variable amplifying circuit comprising:
a pair of resonant circuits, each of which has an inductor a first potential being applied to one end of said inductor, and a variable capacitor which forms a resonant section with said inductor;
a pair of output terminals, each of which is connected to the other end of said inductor of corresponding resonant circuit; and
a pair of switch sections, each of which is connected between corresponding output terminal and a second potential, and one of said switch sections switching on and off between one of said output terminals and said second potential based on one of complementary signals inputted to said switch sections, and the other of said switch sections switching on and off between the other of said output terminals and said second potential based on the other of complementary signals inputted to said switch sections,
wherein amplified signals of said complementary signals are outputted to said pair of output terminals, and impedance frequency characteristics of said resonant circuit are adjusted by adjusting the capacitance value of said variable capacitor so as to rectify the waveform of said output signals.

6. The frequency characteristics-variable amplifying circuit according to claim 5, wherein
said variable capacitor is a variable capacitor to whose one end, the other end of said inductor is connected and to the other end, a control voltage to control the capacitance value of this variable capacitor is applied, and said resonant circuit further has a resistor connected between a connecting point between said inductor and said variable capacitor and said output terminal.

7. The frequency characteristics-variable amplifying circuit according to claim 5, wherein
said variable capacitor is a varactor element.

8. The frequency characteristics-variable amplifying circuit according to claim 5, wherein
said each switch section is a transistor one of whose source and drain is connected to said output terminal, said second potential is applied to the other, and to whose gate, said input signal is inputted.

9. The frequency characteristics-variable amplifying circuit according to claim 8, wherein
the other of the transistor's source and drain of said each switch section is commonly connected, a bias transistor is connected between this common connecting point and said second potential, and a bias voltage is applied to a gate of this bias transistor, and said bias transistor controls said second potential according to said bias voltage.

10. A semiconductor integrated circuit device having the frequency characteristics-variable amplifying circuit according to claim 1.

11. A semiconductor integrated circuit device having the frequency characteristics-variable amplifying circuit according to claim 5.

12. A frequency characteristics-variable amplifying circuit comprising:
a pair of resonant circuits, each of which has an inductor a first potential being applied to one end of said inductor, and a variable capacitor which forms a resonant section with said inductor;
a pair of output terminals, each of which is connected to the other end of said inductor of corresponding resonant circuit; and
a pair of switch sections, each of which is connected between corresponding output terminal and a second potential, and one of said switch sections switching on and off between one of said output terminals and said second potential based on one of complementary signals inputted to said switch sections, and the other of said switch sections switching on and off between the other of said output terminals and said second potential based on the other of complementary signals inputted to said switch sections, wherein said variable capacitor is a variable capacitor to whose one end, the other end of said inductor is connected and to the other end, a control voltage to control the capacitance value of this variable capacitor is applied, and said resonant circuit further has a resistor connected between a connecting point between said inductor and said variable capacitor and said output terminal, and wherein amplified signals of said complementary signals are outputted to said pair of output terminals, and impedance frequency characteristics of said resonant circuit are adjusted by adjusting the capacitance value of said variable capacitor so as to rectify the waveform of said output signals.

13. A frequency characteristics-variable amplifying circuit comprising:

a pair of resonant circuits, each of which is connected between a first potential and a second potential, and has an inductor and a variable capacitor which forms a resonant section with said inductor;

a pair of output terminals, each of which outputs an output signal from corresponding resonant circuit; and a pair of switch sections, one of said switch sections switching on and off between one of said resonant circuit and said first potential or said second potential based on one of complementary signals inputted to said switch sections to make said one of said resonant circuit to output a high or low signal determined by said first potential or said second potential to said corresponding output terminal, and the other of said switch sections switching on and off between the other of said resonant circuit and said first potential or said second potential based on the other of complementary signals inputted to said switch sections to make said the other of resonant circuit to output a high or low signal determined by said first potential or said second potential to said corresponding output terminal, wherein said variable capacitor is a variable capacitor to whose one end, the other end of said inductor is connected and to the other end, a control voltage to control the capacitance value of this variable capacitor is applied, and said resonant circuit further has a resistor connected between a connecting point between said inductor and said variable capacitor and said output terminal, wherein amplified signals of said complementary signals are outputted to said pair of output terminals, and frequency characteristics at the time of amplification can be varied by adjusting the capacitance value of said variable capacitor.

14. The frequency characteristics-variable amplifying circuit according to claim 5, wherein said variable capacitor is a variable capacitor to whose one end, the other end of said inductor is connected and to the other end, a control voltage to control the capacitance value of this variable capacitor is applied.

15. A frequency characteristics-variable amplifying circuit comprising:

a pair of resonant circuits, each of which has an inductor a first potential being applied to one end of said inductor, and a variable capacitor which forms a resonant section with said inductor;

a pair of output terminals, each of which is connected to the other end of said inductor of corresponding resonant circuit; and a pair of switch sections, each of which is connected between corresponding output terminal and a second potential, and one of said switch sections switching on and off between one of said output terminals and said second potential based on one of complementary signals inputted to said switch sections, and the other of said switch sections switching on and off between the other of said output terminals and said second potential based on the other of complementary signals inputted to said switch sections, wherein said variable capacitor is a variable capacitor to whose one end, the other end of said inductor is connected and to the other end, a control voltage to control the capacitance value of this variable capacitor is applied, wherein amplified signals of said complementary signals are outputted to said pair of output terminals, and impedance frequency characteristics of said resonant circuit are adjusted by adjusting the capacitance value of said variable capacitor so as to rectify the waveform of said output signals.

16. A frequency characteristics-variable amplifying circuit comprising:

a pair of resonant circuits, each of which is connected between a first potential and a second potential, and has an inductor and a variable capacitor which forms a resonant section with said inductor;

a pair of output terminals, each of which outputs an output signal from corresponding resonant circuit; and a pair of switch sections, one of said switch sections switching on and off between one of said resonant circuit and said first potential or said second potential based on one of complementary signals inputted to said switch sections to make said one of said resonant circuit to output a high or low signal determined by said first potential or said second potential to said corresponding output terminal, and the other of said switch sections switching on and off between the other of said resonant circuit and said first potential or said second potential based on the other of complementary signals inputted to said switch sections to make said the other of resonant circuit to output a high or low signal determined by said first potential or said second potential to said corresponding output terminal, wherein said variable capacitor is a variable capacitor to whose one end, the other end of said inductor is connected and to the other end, a control voltage to control the capacitance value of this variable capacitor is applied, wherein amplified signals of said complementary signals are outputted to said pair of output terminals, and frequency characteristics at the time of amplification can be varied by adjusting the capacitance value of said variable capacitor.

* * * * *